US009117921B2

(12) United States Patent
Lee et al.

(10) Patent No.: US 9,117,921 B2
(45) Date of Patent: Aug. 25, 2015

(54) THIN FILM TRANSISTOR AND ORGANIC LIGHT EMITTING DIODE DISPLAY

(71) Applicant: Samsung Display Co., Ltd., Yongin, Gyeonggi-Do (KR)

(72) Inventors: Sun-Youl Lee, Gyeonggi-Do (KR); Chi-Wook An, Gyeonggi-Do (KR)

(73) Assignee: Samsung Display Co., Ltd., Yongin-si (KR)

( * ) Notice: Subject to any disclaimer, the term of this patent is extended or adjusted under 35 U.S.C. 154(b) by 56 days.

(21) Appl. No.: 13/971,679

(22) Filed: Aug. 20, 2013

(65) Prior Publication Data

US 2014/0319469 A1  Oct. 30, 2014

(30) Foreign Application Priority Data

Apr. 24, 2013  (KR) .......................... 10-2013-0045562

(51) Int. Cl.
| | |
|---|---|
| *H01L 29/786* | (2006.01) |
| *H01L 27/32* | (2006.01) |
| *H01L 29/423* | (2006.01) |
| *H01L 27/12* | (2006.01) |

(52) U.S. Cl.
CPC ........ *H01L 29/78696* (2013.01); *H01L 27/124* (2013.01); *H01L 29/42384* (2013.01); *H01L 29/78675* (2013.01); *H01L 27/3262* (2013.01); *H01L 27/3276* (2013.01)

(58) Field of Classification Search
CPC .................. H01L 29/78696; H01L 27/124
USPC .............................................. 257/99
See application file for complete search history.

(56) References Cited

U.S. PATENT DOCUMENTS

| | | | | |
|---|---|---|---|---|
| 5,062,690 | A * | 11/1991 | Whetten | 349/55 |
| 5,684,312 | A * | 11/1997 | Yonemoto | 257/291 |
| 5,897,182 | A * | 4/1999 | Miyawaki | 349/43 |
| 8,541,785 | B2 * | 9/2013 | Hosoya et al. | 257/72 |
| 8,629,440 | B2 * | 1/2014 | Kimura | 257/59 |
| 8,674,371 | B2 * | 3/2014 | Yamazaki et al. | 257/72 |
| 8,878,827 | B2 * | 11/2014 | Han et al. | 345/204 |
| 8,907,348 | B2 * | 12/2014 | Miyairi et al. | 257/72 |
| 2007/0114530 | A1 * | 5/2007 | Kimura | 257/59 |
| 2008/0211796 | A1 * | 9/2008 | Kim | 345/204 |
| 2008/0302969 | A1 * | 12/2008 | Jung et al. | 250/370.09 |
| 2009/0135103 | A1 * | 5/2009 | Kim | 345/76 |
| 2009/0206342 | A1 * | 8/2009 | Hosoya et al. | 257/72 |
| 2009/0268119 | A1 * | 10/2009 | Lee et al. | 349/54 |
| 2010/0320473 | A1 * | 12/2010 | Liu | 257/59 |
| 2012/0105388 | A1 * | 5/2012 | Han et al. | 345/204 |
| 2014/0042405 | A1 * | 2/2014 | Moon | 257/40 |
| 2014/0070188 | A1 * | 3/2014 | Park et al. | 257/40 |
| 2014/0077180 | A1 * | 3/2014 | Moon | 257/40 |
| 2014/0117328 | A1 * | 5/2014 | Hur | 257/40 |
| 2014/0225075 | A1 * | 8/2014 | Zhan | 257/40 |
| 2014/0319469 | A1 * | 10/2014 | Lee et al. | 257/40 |

FOREIGN PATENT DOCUMENTS

KR  10-0297067 B1  5/1999

* cited by examiner

*Primary Examiner* — Earl Taylor
(74) *Attorney, Agent, or Firm* — Christie, Parker & Hale, LLP

(57) ABSTRACT

A thin film transistor includes a gate electrode extending from a scan line of a display and having an edge, and a connection line connecting the edge of the gate electrode to the scan line.

13 Claims, 7 Drawing Sheets

THIN FILM TRANSISTOR AND ORGANIC LIGHT EMITTING DIODE DISPLAY

CROSS-REFERENCE TO RELATED APPLICATION

This application claims priority to and the benefit of Korean Patent Application No. 10-2013-0045562 filed in the Korean Intellectual Property Office on Apr. 24, 2013, the entire contents of which are incorporated herein by reference.

BACKGROUND

1. Field

The described technology relates generally to a thin film transistor and an organic light emitting diode display, and more particularly, to a thin film transistor including a gate electrode having an edge, and an organic light emitting diode display including the same.

2. Description of the Related Art

A display device is a device displaying an image, and recently, organic light emitting diode displays have received added attention.

Since the organic light emitting diode display has a self-emission characteristic and does not require a separate light source, unlike for example a liquid crystal display device, it is possible to reduce a thickness and a weight thereof. Further, the organic light emitting diode display has high-quality features and characteristics, such as low power consumption, high luminance, and a high response speed.

In general, the organic light emitting diode display includes gate wires positioned on a substrate and including a scan line extended in one direction, data wires extended in a direction crossing the gate wires, a plurality of thin film transistors connected to the gate wires and the data wires, respectively, and a corresponding organic light emitting diode connected with each thin film transistor.

Recently, pixels used in organic light emitting diode displays include one or more thin film transistors including a plurality of gate electrodes extended from the scan line or lines in order to prevent off leakage.

However, in the thin film transistors including a plurality of gate electrodes in the related art, one or more gate electrodes among the plurality of gate electrodes are extend in a different direction from the direction the scan line extends and forms edges, and as a result, static electricity flowing into through the scan line from the outside is concentrated at the edge of the gate electrode or electrodes, and thus there is a problem in that an insulation layer adjacent to the edges of the gate electrodes may more easily become ruptured.

The above information disclosed in this background section is only for enhancement of understanding of the background of the described technology, and therefore, it may contain information that does not form the prior art that is already known in this country to a person of ordinary skill in the art.

SUMMARY

The described technology has been made in an effort to provide a thin film transistor and an organic light emitting diode display including the same that prevents or reduces occurrences of an insulation layer adjacent to an edge of a gate electrode from being ruptured due to static electricity from the outside.

An exemplary embodiment provides a thin film transistor including a gate electrode extending from a scan line of a display and having an edge; and a connection line connecting the edge of the gate electrode to the scan line.

The thin film transistor may further include an active pattern positioned corresponding to the gate electrode on a different layer of a display than the gate electrode, the active pattern comprising a first conductive area, a first channel area adjacent to the first conductive area, a second conductive area spaced apart from the first conductive area with the first channel area therebetween, a second channel area spaced apart from the first channel area with the second conductive area therebetween, and a third conductive area spaced apart from the second conductive area with the second channel area therebetween. The gate electrode may include a first gate area positioned on the active pattern and traversing the first channel area; and a second gate area positioned on the active pattern and traversing the second channel area, and wherein the edge is part of the first gate area or the second gate area, and the connection line may connect the edge to a scan line of a display and surround the second conductive area together with the first gate area, the second gate area, and the scan line.

A scan line of a display, the first gate area, the second gate area, and the connection line may extend in a closed loop form.

The gate electrode may not overlap with the second conductive area.

The first conductive area, the second conductive area, and the third conductive area may include conductive materials, and the first channel area and the second channel area may include semiconductor materials.

The active pattern may include polysilicon, and the gate electrode may include metal.

Ions may be doped in the first conductive area, the second conductive area, and the third conductive area.

The second conductive area may have one or more curves.

The gate electrode and the connection line may be positioned on a same layer of a display as a scan line of the display.

The connection line may be positioned on a different layer of a display than the gate electrode and a scan line of the display.

The connection line may respectively connect the edge of the gate electrode and the scan line through different contact holes.

Another exemplary embodiment provides an organic light emitting diode display, including a substrate; an organic light emitting diode on the substrate; and a thin film transistor connected with the organic light emitting diode, where the thin film transistor includes a gate electrode extending from a scan line of a display and having an edge, and a connection line connecting the edge of the gate electrode to the scan line.

The organic light emitting diode of the display may include a first electrode connected to the thin film transistor; an organic emission layer on the first electrode; and a second electrode on the organic emission layer.

According to exemplary embodiments of the present invention, it is possible to provide a thin film transistor and an organic light emitting diode display including the same which prevents or reduces an insulation layer adjacent to an edge of a gate electrode from being ruptured due to static electricity from the outside.

DETAILED DESCRIPTION

Figure 1:
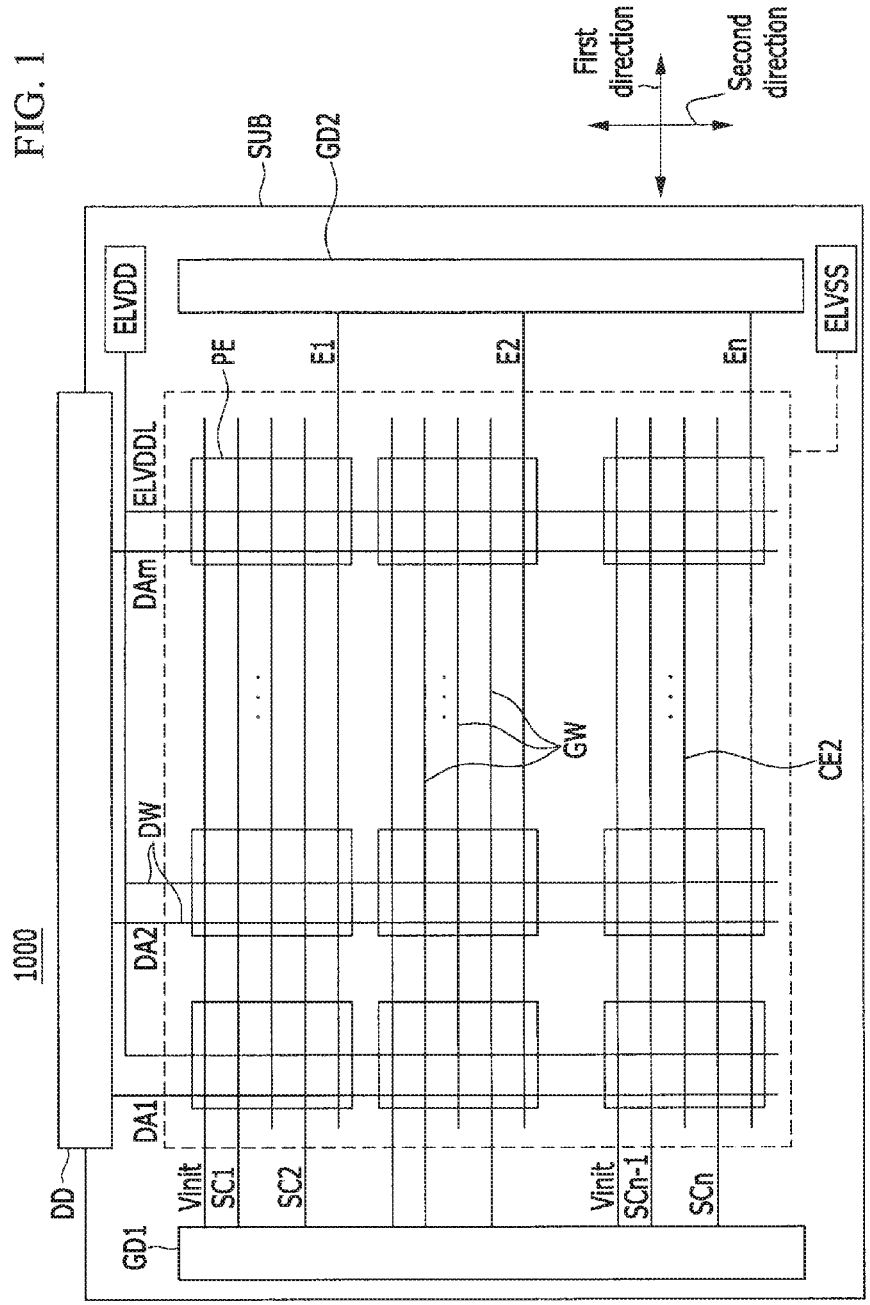
FIG. 1 is a diagram illustrating an organic light emitting diode display according to a first exemplary embodiment of the present disclosure.

In the following detailed description, only certain exemplary embodiments have been shown and described, by way of illustration. As those skilled in the art will realize, the described embodiments may be modified in various different ways without departing from the spirit or scope of the present invention.

Accordingly, the drawings and description are to be regarded as illustrative in nature, and not restrictive. Like reference numerals designate like elements throughout the specification.

Further, in exemplary embodiments, since like reference numerals designate like elements having the same or similar configuration, a first exemplary embodiment is representatively described, and in other exemplary embodiments, only configurations or portions different from the first exemplary embodiment will be described.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element, or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Hereinafter, an organic light emitting diode display according to a first exemplary embodiment will be described with reference to FIGS. 1 to 4. Hereinafter, thin film transistors mean a third thin film transistor and a fourth thin film transistor, respectively, from among various transistors described below, gate electrodes mean a third gate electrode and a fourth gate electrode, respectively, from among various gate electrodes described below, scan lines mean a first scan line and a second scan line, respectively, and connection lines mean a first connection line and a second connection line, respectively.

FIG. 1 is a diagram illustrating an organic light emitting diode display according to a first exemplary embodiment.

As illustrated in FIG. 1, an organic light emitting diode display 1000 according to the first exemplary embodiment includes a gate driver GD1, gate wires GW, a light emission control driver GD2, a data driver DD, data wires DW, and pixels PE.

The gate driver GD1 sequentially supplies scan signals to first scan lines SC1-SCn-1 and second scan lines SC2-SCn included in the gate wires GW in response to control signals supplied from an external control circuit (not illustrated), for example, a timing controller or other controller. Then, the pixels PE are selected by the scan signals to sequentially receive data signals.

The gate wires GW are positioned on a substrate SUB and extend in a first direction. The gate wires GW include a first scan line, for example, line SCn-1, light emission control lines E1-En, a second scan line, for example, line SCn, an initial power line Vinit, and a second capacitor electrode CE2 to be described below. The first scan line SCn-1 is connected with the gate driver GD1, and receives a scan signal from the gate driver GD1. The light emission control line En is connected with the light emission control driver GD2, and receives a light emission control signal from the light emission control driver GD2. The second scan line SCn is connected with the gate driver GD1, and receives a scan signal from the gate driver GD1. The initial power line Vinit is connected with the gate driver GD1, and receives initial power from the gate driver GD1. The second capacitor electrode CE2 is spaced apart from the first scan line SCn-1 and extends in the first direction.

As such, the initial power line Vinit, the first scan line SCn-1, the second capacitor electrode CE2, the second scan line SCn, and the light emission control line En are spaced apart from each other and extend in the first direction. Further, the initial power line Vinit, the first scan line SCn-1, the second capacitor electrode CE2, the second scan line SCn, and the light emission control line En are positioned on the same layer and formed of the same material, and may be formed through one process such as photolithography.

Meanwhile, in another exemplary embodiment, the initial power line Vinit, the first scan line SCn-1, the second capacitor electrode CE2, the second scan line SCn, and the light emission control line En are positioned on different layers and may be formed of different materials.

Further, in the first exemplary embodiment, the initial power line Vinit receives the initial power from the gate driver GD1, but in another exemplary embodiment, the initial power line Vinit is connected with another additional element to receive initial power from the additional element.

The light emission control driver GD2 sequentially supplies a light emission control signal to the light emission control line En in response to a control signal supplied from the outside, such as from a timing controller. The emission of the pixel PE is controlled by the light emission control signal.

That is, the light emission control signal controls an emission time of the pixel PE. However, the light emission control driver GD2 may be omitted depending on an internal structure of the pixel PE.

Meanwhile, in another embodiment, the light emission control driver GD2 may be integrally formed with the gate driver GD1.

The data driver DD supplies a data signal to a data line DAm from among the data wires DW in response to a control signal supplied from the outside, such as from a timing controller. The data signal supplied to the data line DAm is supplied to the pixel PE selected by the scan signal whenever the scan signal is supplied to the second scan line SCn. Then, the pixel PE charges a voltage corresponding to the data signal and emits light with luminance corresponding to the voltage.

The data wires DW are positioned over the gate wires GW and extend in a second direction crossing the first direction. The data wires DW include data lines DA1-DAm and a driving power line ELVDDL. The data line, for example, line DAm is connected with the data driver DD, and receives the data signal from the data driver DD. The driving power line ELVDDL is connected with a first external power supply ELVDD, to be described below, and receives driving power from the first power supply ELVDD.

The pixel PE is positioned in a crossing area of the gate wires GW and the data wires DW, and includes an organic light emitting diode for emitting light with luminance corresponding to a driving current corresponding to the data signal, a plurality of thin film transistors for controlling the driving current flowing through the organic light emitting diode, and one or more capacitors. The plurality of thin film transistors and one or more capacitors are connected to the gate wires GW and the data wires DW, respectively, and the organic light emitting diode is connected with the plurality of thin film transistors and one or more capacitors. The organic light emitting diode is connected between the first power supply ELVDD and a second power supply ELVSS.

Figure 2:
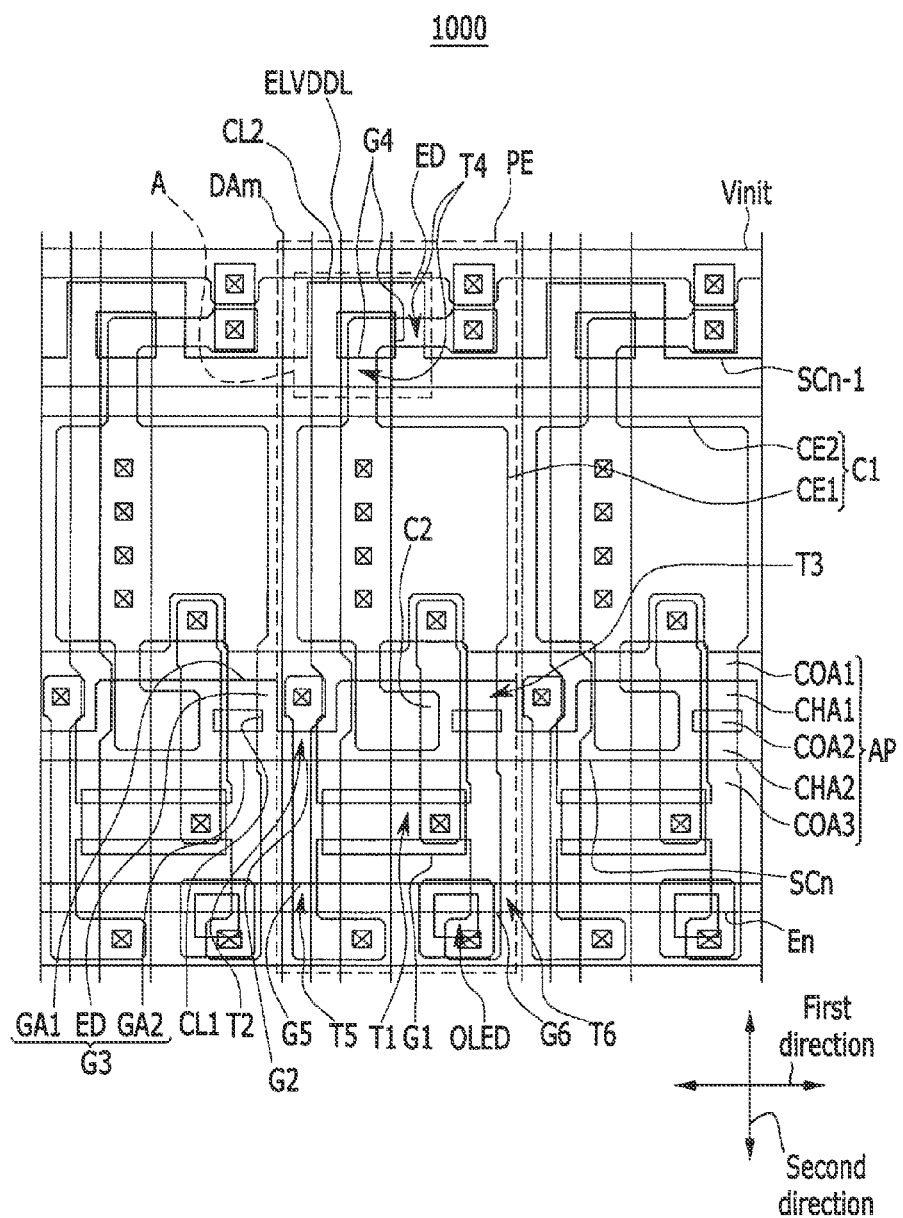
FIG. 2 is a layout view illustrating a pixel portion illustrated in FIG. 1.
Figure 3:
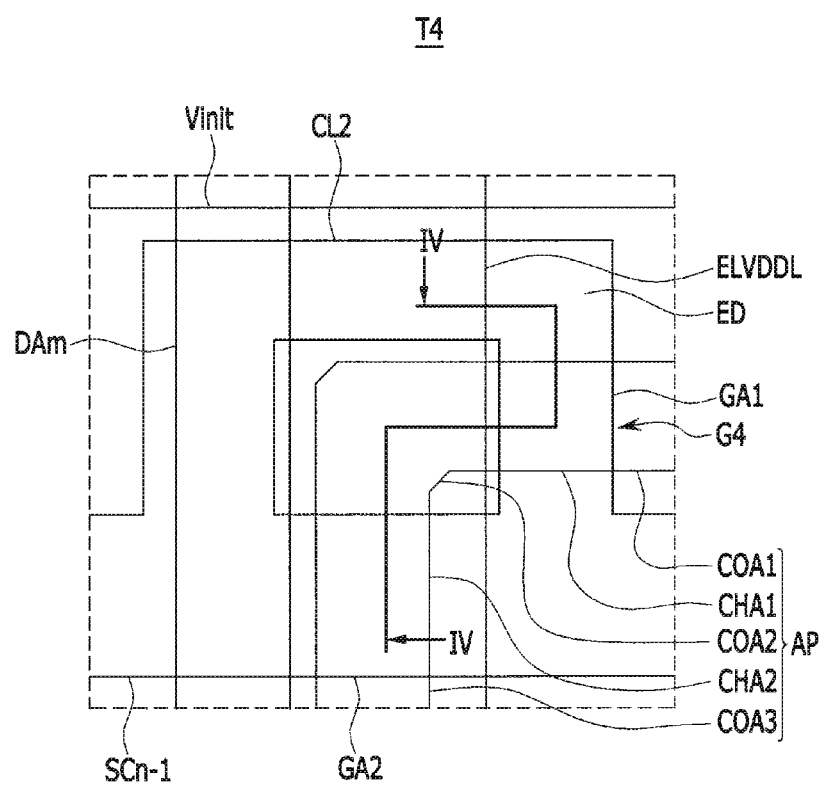
FIG. 3 is a diagram enlarging a portion A of FIG. 2.
Figure 4:
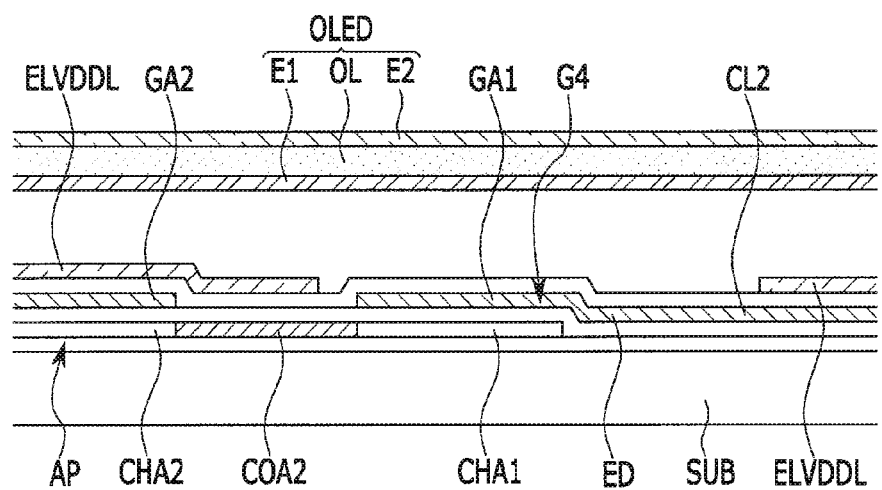
FIG. 4 is a cross-sectional view taken along line IV-IV of FIG. 3.

FIG. 2 is a layout view illustrating a pixel portion illustrated in FIG. 1. FIG. 3 is a diagram enlarging a portion A of FIG. 2. FIG. 4 is a cross-sectional view taken along line IV-IV of FIG. 3.

As illustrated in FIGS. 2 to 4, the pixel PE includes a pixel circuit including an organic light emitting diode OLED (illustrated in FIG. 4) connected between the first power supply ELVDD and the second power supply ELVSS, six thin film transistors connected between the organic light emitting diode OLED and the first power supply ELVDD to control driving power supplied to the organic light emitting diode OLED, and two capacitors.

The organic light emitting diode OLED includes a first electrode E1, an organic emission layer OL positioned on the first electrode E1, and a second electrode E2 positioned on the organic emission layer OL. The first electrode E1, which is an anode of the organic light emitting diode OLED, is connected to the driving power line ELVDDL connected to the first power supply ELVDD via the pixel circuit, and the second electrode E2, which is a cathode of the organic light emitting diode OLED, is connected to the second power supply ELVSS. The organic emission layer OL of the organic light emitting diode OLED emits light with luminance corresponding to the driving current flowing through the organic light emitting diode OLED when driving power is supplied from the first power supply ELVDD through the pixel circuit and common power is supplied from the second power supply ELVSS.

The pixel circuit includes a first thin film transistor T1, a second thin film transistor T2, a third thin film transistor T3, a fourth thin film transistor T4, a fifth thin film transistor T5, a sixth thin film transistor T6, a first capacitor C1, and a second capacitor C2.

The first thin film transistor T1 is connected between the driving power line ELVDDL and the first electrode E1 of the organic light emitting diode OLED, and supplies a driving power, corresponding to the data signal, from the first power supply ELVDD to the organic light emitting diode OLED for an emission period of the pixel PE. The first thin film transistor T1 functions as a driving transistor of the pixel PE. A first gate electrode G1 of the first thin film transistor T1 is connected to a first capacitor electrode CE1 of the first capacitor C1, a second capacitor C2, a third thin film transistor 13, and a fourth thin film transistor T4, respectively, and a source electrode is connected to a second thin film transistor T2 and a fifth thin film transistor T5, respectively, and a drain electrode is connected with a third thin film transistor T3 and a sixth thin film transistor T6, respectively. The first electrode E1 of the organic light emitting diode OLED is connected to the first thin film transistor T1 through the sixth thin film transistor T6.

The second thin film transistor T2 connects the data line DAm and the first thin film transistor T1, and includes a second gate electrode G2 connected to the second scan line SCn. The second thin film transistor T2 transfers the data signal supplied from the data line DAm into the pixel PE when the scan signal is supplied from the second scan line SCn. The second thin film transistor T2 functions as a switching transistor of the pixel PE.

The third thin film transistor T3 connects another portion of the first thin film transistor T1 to the first gate electrode G1, and includes a third gate electrode G3 connected to the second scan line SCn. The third thin film transistor T3 connects the first thin film transistor T1 in a diode form when the data signal is supplied to the pixel PE, to compensate for a threshold voltage of the first thin film transistor T1. That is, the third thin film transistor T3 functions as a compensation transistor of the pixel PE.

The third thin film transistor 13 includes an active pattern AP, a third gate electrode G3, and a first connection line CL1.

The active pattern AP connects the first gate electrode G1 and another portion of the first thin film transistor T1, and in detail, connects the first capacitor electrode CE1 of the first capacitor C1 and the active layer of the first thin film transistor T1.

The active pattern AP includes a first conductive area COA1, a first channel area CHA1, a second conductive area COA2, a second channel area CHA2, and a third conductive area COA3 which are sequentially extended in a second direction, which is a set direction as shown in FIG. 2.

The first conductive area COA1 connects the first capacitor electrode CE1 and the first channel area CHA1, and has conductor characteristics because ions are doped in polysilicon. That is, the first conductive area COA1 is formed of a conductive material.

The first channel area CHA1 is adjacent to the first conductive area COA1 to connect the first conductive area COA1 and the second conductive area COA2, and includes polysilicon, which is a semiconductor material, to have semiconductor characteristics. That is, the first channel area CHA1 is formed of a semiconductor material.

The second conductive area COA2 is spaced apart from the first conductive area COA1, with the first channel area CHA1 therebetween, to connect the first channel area CHA1 and the second channel area CHA2, and has conductor characteristics because ions are doped in polysilicon.

The second channel area CHA2 is spaced apart from the first channel area CHA1, with the second conductive area COA2 therebetween, to connect the second conductive area COA2 and the third conductive area COA3, and includes polysilicon, which is a semiconductor material, to have semiconductor characteristics. That is, the second channel area CHA2 is formed of a semiconductor material.

The third conductive area COA3 is spaced apart from the second conductive area COA2, with the second channel area CHA2 therebetween, to connect the second channel area CHA2 and the active layer of the first thin film transistor T1, and has conductor characteristics because ions are doped in polysilicon. That is, the third conductive area COA3 is formed of a conductive material.

The third gate electrode G3 and the first connection line CU are positioned on the active pattern AP described above.

The third gate electrode G3 is connected with the second scan line SCn and does not overlap with the second conductive area COA2 of the active pattern AP, and includes a first gate area GA1 and a second gate area GA2 including metal, which is a conductive material.

The first gate area GA1 is positioned on the first channel area CHA1 to traverse the first channel area CHA1 in the first direction. The first gate area GA1 is spaced apart from the second gate area GA2 and then extended from the second scan line SCn to have an edge ED in the first direction The second gate area GA2 is spaced apart from the first gate area GA1 and positioned on the second channel area CHA2, and traverses the second channel area CHA2 in the first direction. The second gate area GA2 extends over on the second scan line SCn in the first direction.

The first connection line CL1 connects the edge ED of the first gate area GA1 of the third gate electrode G3 and the second scan line SCn. As a result, the first connection line CL1 surrounds the second conductive area COA2 together with the first gate area GA1, the second gate area GA2, and the second scan line SCn. The first connection line CL1 does not overlap with the second conductive area COA2.

The first connection line CL1 and the third gate electrode G3 are positioned on the same layer as the second scan line SCn, and the first connection line CL1, the third gate electrode G3, and the second scan line SCn are integrally formed. The first connection line CL1, the third gate electrode G3, and the second scan line SCn may be formed at one time by using a photolithography or similar process.

In addition, the first connection line CL1 and the third gate electrode G3 do not overlap with the second conductive area COA2. The second scan line SCn, the first gate area GA1, the second gate area GA2, and the first connection line CL1 extend in a closed loop form to surround the second conductive area COA2.

As such, in the third thin film transistor T3, the first connection line CL1 connects the edge ED of the first gate area GA1 and the second scan line SCn. As a result, although static electricity may flow through the second scan line SCn from the outside, since the static electricity is not concentrated at the edge ED of the first gate area GA1, and instead can move to the second scan line SCn again through the first connection line CL1, the insulation layer adjacent to the edge ED of the third gate electrode G3 is prevented from being easily ruptured.

The fourth thin film transistor 14 connects the initial power line Vinit and the first gate electrode G1 of the first thin film transistor T1. The fourth thin film transistor T4 transfers the initial power supplied from the initial power line Vinit to the pixel PE to initialize the first thin film transistor T1 when the scan signal is supplied from the first scan line SCn-1 for an initial period before a data programming period, so that the data signal is more smoothly supplied to the pixel PE for the data programming period when the data signal is input to the pixel PE. That is, the fourth thin film transistor T4 functions as a switching transistor of the pixel PE. The fourth thin film transistor T4 includes an active pattern AP, a fourth gate electrode G4, and a second connection line CL2.

The active pattern AP connects the initial power line Vinit and the first gate electrode G1 of the first thin film transistor T1, and in greater detail, connects the initial power line Vinit and the first capacitor electrode CE1 of the first capacitor C1.

The active pattern AP includes a first conductive area COA1, a first channel area CHA1, a second conductive area COA2, a second channel area CHA2, and a third conductive area COA3, which are sequentially extended in a set direction.

The first conductive area COA1 connects the initial power line Vinit and the first channel area CHA1, and has conductor characteristics because ions are doped in polysilicon. That is, the first conductive area COA1 is formed of a conductive material.

The first channel area CHA1 is adjacent to the first conductive area COA1 to connect the first conductive area COA1 and the second conductive area COA2, and includes polysilicon, which is a semiconductor material, to have semiconductor characteristics. That is, the first channel area CHA1 is formed of a semiconductor material.

The second conductive area COA2 is spaced apart from the first conductive area COA1, with the first channel area CHA1 therebetween, to connect the first channel area CHA1 and the second channel area CHA2, and has conductor characteristics because ions are doped in polysilicon. That is, the second conductive area COA2 is formed of a conductive material. The second conductive area COA2 has a once-curved form, and is curved once from the first channel area CHA1 and extends to the second channel area CHA2.

Meanwhile, in another exemplary embodiment, the second conductive area COA2 may have a form which is curved two or more times, corresponding to a design of the entire pixel PE.

The second channel area CHA2 is spaced apart from the first channel area CHA1, with the second conductive area COA2 therebetween, to connect the second conductive area COA2 and the third conductive area COA3, and includes polysilicon, which is a semiconductor material, to have semiconductor characteristics. That is, the second channel area CHA2 is formed of a semiconductor material.

The third conductive area COA3 is spaced apart from the second conductive area COA2, with the second channel area CHA2 therebetween, to connect the second channel area CHA2 and the first capacitor electrode CE1 of the first capacitor C1, and has conductor characteristics because ions are doped in polysilicon. That is, the third conducive area COA3 is formed of a conductive material.

The fourth gate electrode G4 and the second connection line CL2 are positioned on the active pattern AP described above, with the insulation layer therebetween.

The fourth gate electrode G4 is connected with the first scan line SCn-1, does not overlap with the second conductive area COA2 of the active pattern AP, and includes a first gate area GA1 and a second gate area GA2 including metal, which is a conductive material.

The first gate area GA1 is positioned on the first channel area CHA1 to traverse the first channel area CHA1 in a second direction. The first gate area GA1 extends in the second direction to cross the first direction, which is the direction of extension of the first scan line SCn-1, to have an edge ED in the second direction.

The second gate area GA2 is spaced apart from the first gate area GA1 and positioned on the second channel area CHA2, and traverses the second channel area CHA2 in the first direction. The second gate area GA2 is positioned on the first scan line SCn-1 which extends in the first direction.

The second connection line CL2 connects the edge ED of the first gate area GA1 of the fourth gate electrode G4 and the first scan line SCn-1. As a result, the second connection line CL2 surrounds the second conductive area COA2 together with the first gate area GA1, the second gate area GA2, and the first scan line SCn-1. The second connection line CL2 does not overlap with the second conductive area COA2.

The second connection line CL2 and the fourth gate electrode G4 are positioned on the same layer as the first scan line SCn-1. Thus, the second connection line CL2, the fourth gate electrode G4, and the first scan line SCn-1 are integrally formed. The second connection line CL2, the fourth gate electrode G4, and the first scan line SCn-1 may be formed at the same time by using a photolithography or similar process.

In addition, the second connection line CL2 and the fourth gate electrode G4 do not overlap with the second conductive area COA2. The first scan line SCn-1, the first gate area GA1, the second gate area GA2, and the second connection line CL2 extend in a closed loop form to surround the second conductive area COA2.

As such, in the fourth thin film transistor T4, the first connection line CL1 connects the edge ED of the first gate area GA1 and the first scan line SCn-1. As a result, although static electricity may flow through the first scan line SCn-1 from the outside, since the static electricity is not concentrated at the edge ED of the first gate area GA1, and instead can move to the first scan line SCn-1 again through the second connection line CL2, the insulation layer adjacent to the edge ED of the fourth gate electrode G4 is prevented from being easily ruptured.

Meanwhile, in the first exemplary embodiment, the third thin film transistor T3 and the fourth thin film transistor T4 are positioned in the pixel PE, but in another exemplary embodiment, a thin film transistor having the same shape as the third thin film transistor or the fourth thin film transistor may instead be positioned in the gate driver or the data driver.

The fifth thin film transistor t5 connects the driving power line ELVDDL and the first thin film transistor T1, and includes a fifth gate electrode G5 connected with the light emission control line En. The fifth thin film transistor T5 interrupts the connection between the driving power line ELVDDL connected to the first power supply ELVDD and the first thin film transistor T1 during a non-emission period of the pixel PE, and connects the driving power line ELVDDL and the first thin film transistor T1 during an emission period of the pixel PE. That is, the fifth thin film transistor T5 functions as another switching transistor of the pixel PE.

The sixth thin film transistor T6 connects the first thin film transistor T1 and a first electrode E1 of the organic light emitting diode OLED, and includes a sixth gate electrode G6 connected with the light emission control line En. The sixth thin film transistor T6 interrupts the connection between the first thin film transistor T1 and the organic light emitting diode OLED during a non-emission period of the pixel PE, and connects the first thin film transistor T1 and the organic light emitting diode OLED during an emission period of the pixel PE. That is, the sixth thin film transistor T6 functions as another switching transistor of the pixel PE.

Further, the first gate electrode G1, the second gate electrode G2, the third gate electrode G3, the fourth gate electrode G4, the fifth gate electrode G5, and the sixth gate electrode G6 of the respective thing film transistors are positioned on the same layer, and may be formed at the same time as the gate wires GW by using a single process, such as photolithography.

The first capacitor C1 stores the data signal supplied into the pixel PE for a data programming period, and maintains the stored data signal for one frame, and is formed between the driving power line ELVDDL connected with the first power supply ELVDD and the first gate electrode G1 of the first thin film transistor T1 connected to the initial power line Vinit. The first capacitor C1 functions as a storage capacitor.

The first capacitor C1 is positioned on the substrate SUB, and includes a first capacitor electrode CE1 and a second capacitor electrode CE2, which face each other with a first insulation layer IL1 therebetween.

The first capacitor electrode CE1 is connected with the initial power line Vinit through the fourth thin film transistor T4, and is positioned on the same layer as the active pattern AP.

The second capacitor electrode CE2 is connected with the driving power line ELVDDL, and is positioned on the same layer as the gate wires GW. The second capacitor electrode CE2 traverses the adjacent pixel PE and extends in the first direction, as illustrated in FIG. 1.

The second capacitor C2 compensates for voltage drops due to a load in the organic light emitting diode display 1000, and is formed between the first capacitor electrode CE1 of the first capacitor C1 and the second scan line SCn. That is, the second capacitor C2 functions as a boosting capacitor, compensating for the voltage drop due to the load in the organic light emitting diode display 1000 by increasing voltage of the first gate electrode G1 of the first thin film transistor T1 by a coupling action when a voltage level of a current scan signal is changed, particularly, when the supply of the current scan signal is interrupted.

Hereinafter, an operation of the pixel PE will be described.

First, a previous scan signal at a low level is supplied through the first scan line SCn-1 for a first period, set as an initial period. Then, the fourth thin film transistor T4 is turned on in response to the previous scan signal at the low level, and the initial power is supplied from the initial power line Vinit to the first thin film transistor T1 through the fourth thin film transistor T4 to initialize the first thin film transistor T1.

Thereafter, a current scan signal at a low level is supplied through the second scan line SCn for a second period, set as a data programming period. Then, the second thin film transistor T2 and the third thin film transistor T3 are turned on in response to the current scan signal at the low level.

In addition, the first thin film transistor T1 is turned on in a diode-connected state by the third thin film transistor T3, and particularly, since the first thin film transistor T1 is initialized during the previous period, the first thin film transistor T1 is diode-connected in a forward direction.

As a result, the data signal supplied from the data line DAm passes through the second thin film transistor T2, the first thin film transistor T1, and the third thin film transistor T3, and thus voltage corresponding to a difference between the data signal and the threshold voltage of the first thin film transistor T1 is stored in the first capacitor C1.

Thereafter, when the voltage level of the current scan signal is changed to a high level to end the current scan signal, voltage applied to the first gate electrode G1 of the first thin film transistor T1 is changed in response to a voltage change width of the current scan signal, due to the coupling action of the second capacitor C2. In this case, since the voltage applied to the first gate electrode G1 of the first thin film transistor T1 is changed by charge sharing between the first capacitor C1 and the second capacitor C2, a change amount of the voltage applied to the first gate electrode G1 is changed in proportion to a charge sharing value between the first capacitor C1 and the second capacitor C2, in addition to the voltage change width of the current scan signal.

Thereafter, the light emission control signal supplied from the light emission control line En, for a third period set as an emission period, is changed from a high level to a low level. Then, the fifth thin film transistor T5 and the sixth thin film transistor T6 are turned on by the light emission control signal at the low level for the third period. As a result, driving current is supplied on a path from the first power supply ELVDD to the second power supply ELVSS via the driving power line ELVDDL, the fifth thin film transistor T5, the first thin film transistor T1, the sixth thin film transistor T6, and the organic light emitting diode OLED.

The driving current is controlled by the first thin film transistor T1, and the first thin film transistor T1 generates driving current having a magnitude corresponding to the voltage supplied to the first gate electrode G1 of the first thin film transistor T1. In this case, since the threshold voltage of the first thin film transistor T1 is stored in the first capacitor C1 in the second period, the threshold voltage of the first transistor T1 is compensated for during the third period.

As such, even though the organic light emitting diode display 1000 according to the first exemplary embodiment includes the third gate electrode G3 of the third thin film transistor T3 and the fourth gate electrode G4 of the fourth thin film transistor 14, which each has a dual gate area, respectively, the first connection line CL1 and the second connection line CL2 respectively connect the edge ED of the third gate electrode G3 and the edge ED of the fourth gate electrode G4 with the second scan line SCn and the first scan line SCn-1. As a result, even though static electricity flows through the second scan line SCn and the first scan line SCn-1 from the outside, since the static electricity is not concentrated at the edge ED of the third gate electrode G3 and the edge ED of the fourth gate electrode G4, but instead moves back to the second scan line SCn and the first scan line SCn-1 through the first connection line CL1 and the second connection line CL2, respectively, insulation layers adjacent to the edge ED of the third gate electrode G3 and the edge ED of the fourth gate electrode G4 are prevented from being easily ruptured.

Therefore, the third thin film transistor 13 and the fourth thin film transistor 14, in which the third gate electrode G3 and the fourth gate electrode G4 are prevented from being short-circuited with other elements due to static electricity, are provided, and as a result, an organic light emitting diode display 1000 that is more resistant to the effects of static electricity is provided.

Figure 6:
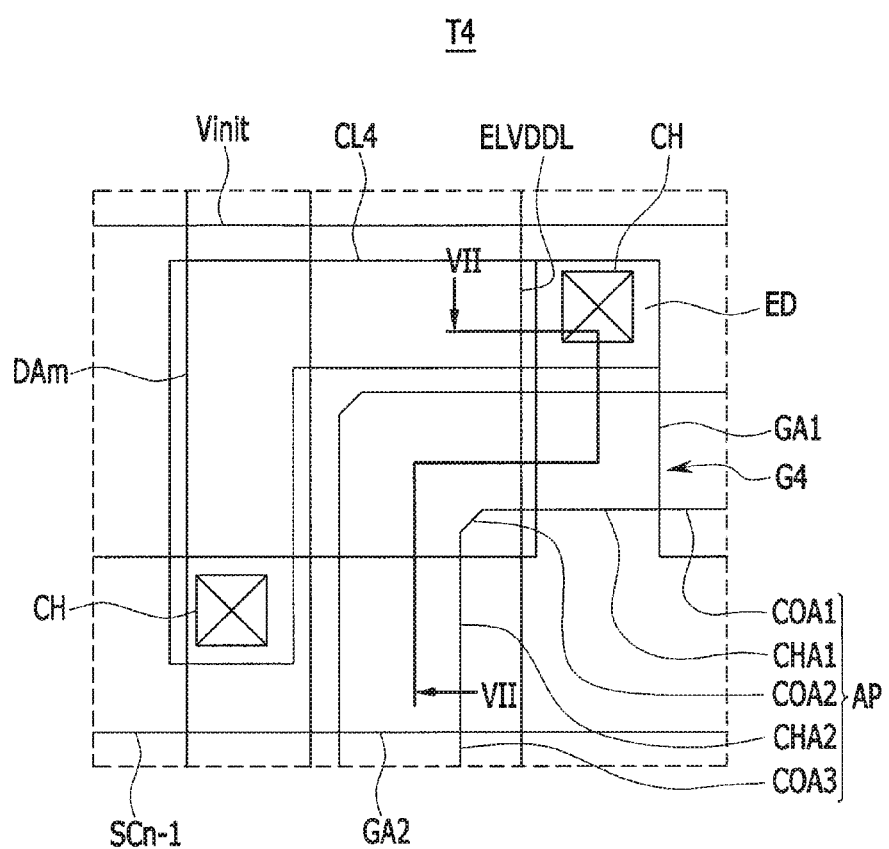
FIG. 6 is a diagram enlarging a portion B of FIG. 5.
Figure 7:
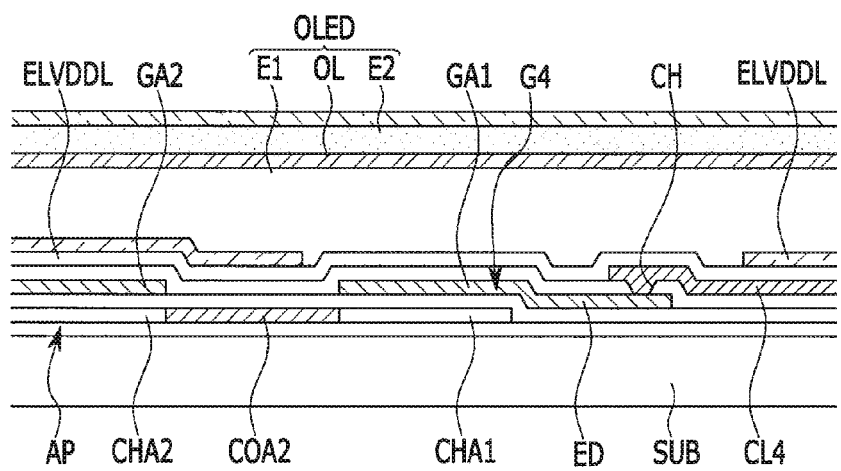
FIG. 7 is a cross-sectional view taken along line VII-VII of FIG. 6.

Hereinafter, an organic light emitting diode display according to a second exemplary embodiment will be described with reference to FIGS. 5 to 7. Hereinafter, connection lines mean a third connection line and a fourth connection line.

Hereinafter, only features distinguished or different from those of the first exemplary embodiment are extracted and described, while portions for which descriptions are omitted follow or are similar to the first exemplary embodiment. In addition, in the second exemplary embodiment, for convenience of description, the same or similar constituent elements will be described by using the same reference numerals as in the first exemplary embodiment.

Figure 5:
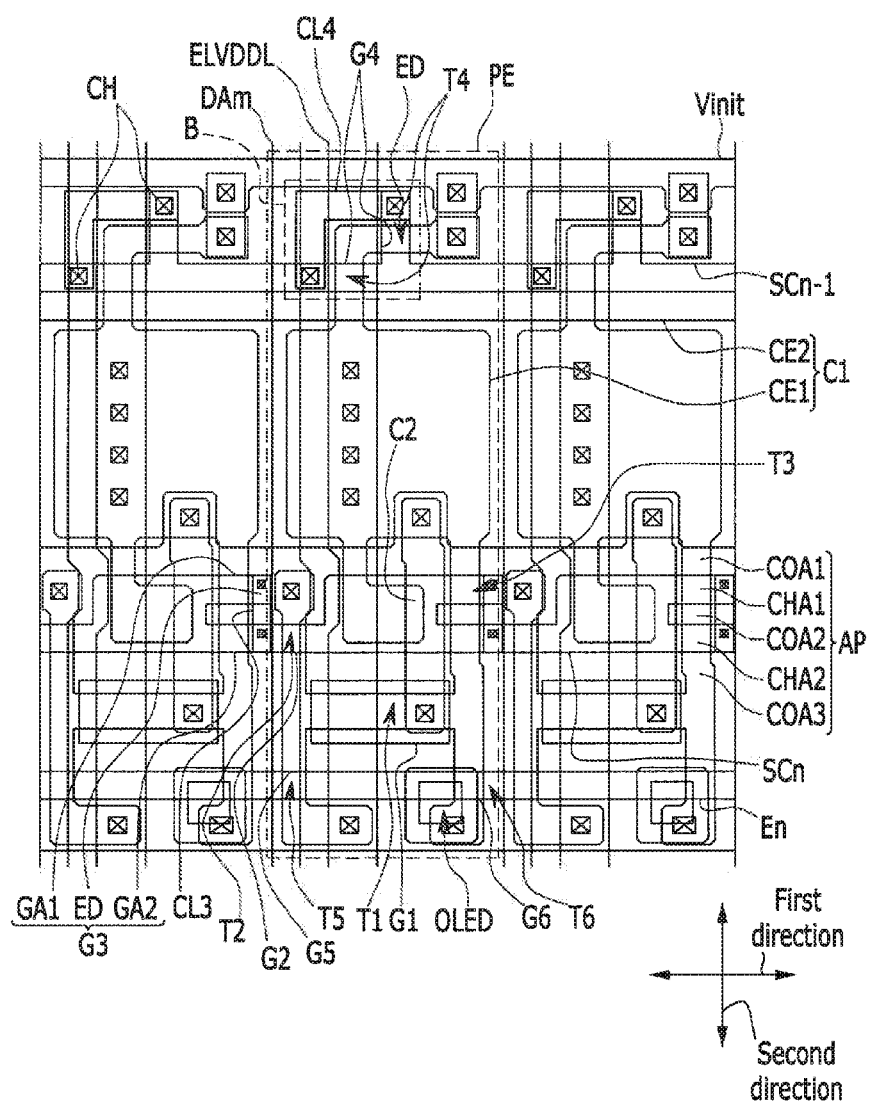
FIG. 5 is a layout view illustrating pixels of an organic light emitting diode display according to a second exemplary embodiment.

FIG. 5 is a layout view illustrating pixels of an organic light emitting diode display according to a second exemplary embodiment. FIG. 6 is a diagram enlarging a portion B of FIG. 5. FIG. 7 is a cross-sectional view taken along line VII-VII of FIG. 6.

A third thin film transistor T3 includes an active pattern AP, a third gate electrode G3, and a third connection line CL3.

The third connection line CL3 connects an edge ED of a first gate area GA1 of the third gate electrode G3 and a second scan line SCn. As a result, the third connection line CL3 surrounds a second conductive area COA2 together with the first gate area GA1, the second gate area GA2, and the second scan line SCn. The third connection line CL3 does not overlap with the second conductive area COA2.

The third connection line CL3 is positioned on a different layer from the third gate electrode G3 and the second scan line SCn, and connects the edge ED of the third gate electrode G3 with the second scan line SCn through different contact holes CH.

In this embodiment, in the third thin film transistor T3, the third connection line CL3 connects the edge ED of the first gate area GA1 with the second scan line SCn. As a result, although static electricity flows through the second scan line SCn from the outside, since the static electricity is not concentrated at the edge ED of the first gate area GA1, but instead moves back to the second scan line SCn through the third connection line CL3, an insulation layer adjacent to the edge ED of the third gate electrode G3 is prevented from being easily ruptured.

Further, since the third connection line CL3 is positioned on a different layer than the third gate electrode G3 and the second scan line SCn, and thus a portion where the third connection line CL3 is positioned may be three-dimensionally set, a layout of the entire third thin film transistor T3, as well as other configurations positioned around the third thin film transistor T3, may be more easily set.

A fourth thin film transistor T4 includes an active pattern AP, a fourth gate electrode G4, and a fourth connection line CL4.

The fourth connection line CL4 connects the edge ED of the first gate area GA1 of the fourth gate electrode G4 and the first scan line SCn-1. As a result, the fourth connection line CL4 surrounds a second conductive area COA2 together with the first gate area GA1, the second gate area GA2, and the first scan line SCn-1. The fourth connection line CL4 does not overlap with the second conductive area COA2.

The fourth connection line CL4 is positioned on a different layer than the fourth gate electrode G4 and the first scan line SCn-1, and connects the edge ED of the fourth gate electrode G4 with the first scan line SCn-1 through different contact holes CH.

As such, in the fourth thin film transistor T4, the fourth connection line CL4 connects the edge ED of the first gate area GA1 with the first scan line SCn-1. As a result, although static electricity flows through the first scan line SCn-1 from the outside, since the static electricity is not concentrated at the edge ED of the first gate area GA1, but instead moves back to the first scan line SCn-1 through the fourth connection line CL4, the insulation layer adjacent to the edge ED of the fourth gate electrode G4 is prevented from being easily ruptured.

Further, since the fourth connection line CL4 is positioned on a different layer than the fourth gate electrode G4 and the first scan line SCn-1, a portion where the fourth connection line CL4 is positioned may be three-dimensionally set, and a layout of the entire fourth thin film transistor T4, as well as other configurations positioned around the fourth thin film transistor T4, may be more easily set.

As such, even though the organic light emitting diode display 1002 according to the second exemplary embodiment includes the third gate electrode G3 of the third thin film transistor T3 and the fourth gate electrode G4 of the fourth thin film transistor T4, which each has a dual gate area, respectively, the third connection line CL3 and the fourth connection line CL4 respectively connect the edge ED of the third gate electrode G3 and the edge ED of the fourth gate electrode G4 with the second scan line SCn and the first scan line SCn-1. As a result, even though static electricity flows through the second scan line SCn and the first scan line SCn-1 from the outside, since the static electricity is not concentrated at the edge ED of the third gate electrode G3 and the edge ED of the fourth gate electrode G4, but instead moves back to the second scan line SCn and the first scan line SCn-1 through the third connection line CL3 and the fourth connection line CL4, respectively, insulation layers adjacent to the edge ED of the third gate electrode G3 and the edge ED of the fourth gate electrode G4 are prevented from being easily ruptured.

Therefore, the third thin film transistor 13 and the fourth thin film transistor 14, in which the third gate electrode G3 and the fourth gate electrode G4 are prevented from being short-circuited with other elements due to static electricity, are provided, and as a result, an organic light emitting diode display 1002 that is more resistant to the effects of static electricity is provided.

Further, in the organic light emitting diode display 1002 according to the second exemplary embodiment, since the third connection line CL3 is positioned on the different layer from the third gate electrode G3 and the second scan line SCn, a portion where the third connection line CL3 is positioned may be three-dimensionally set, and a layout of the entire third thin film transistor T3 and other configurations positioned around the third thin film transistor T3 may be more easily set.

Further, in the organic light emitting diode display 1002 according to the second exemplary embodiment, since the fourth connection line CL4 is positioned on a different layer from the fourth gate electrode G4 and the first scan line SCn-1, a portion where the fourth connection line CL4 is positioned may be three-dimensionally set, and a layout of the entire fourth thin film transistor T4 and other configurations positioned around the fourth thin film transistor T4 may be more easily set.

That is, since the third connection line CL3 and the fourth connection line CL4 are positioned on different layers from the third gate electrode G3 and the fourth gate electrode G4, respectively, the configuration of the entire pixel PX may be more easily set. In this manner, a high-resolution organic light emitting diode display 1002 in which more pixels PE may be disposed in a set area by more easily reducing the size of each pixel PE is provided.

While this disclosure has been described in connection with what is presently considered to be practical exemplary embodiments, it is to be understood that the invention is not limited to the disclosed embodiments, but, is instead intended to cover various modifications and equivalent arrangements included within the spirit and scope of the appended claims.

What is claimed is:

1. A thin film transistor comprising:
   a gate electrode extending from a scan line of a display and having an edge;
   a connection line connecting the edge of the gate electrode to the scan line; and
   an active pattern positioned corresponding to the gate electrode on a different layer of the display than the gate electrode, the active pattern comprising a first conductive area, a first channel area adjacent to the first conductive area, a second conductive area spaced apart from the first conductive area with the first channel area therebetween, a second channel area spaced apart from the first channel area with the second conductive area therebetween, and a third conductive area spaced apart from the second conductive area with the second channel area therebetween.

2. The thin film transistor of claim 1, wherein the gate electrode comprises:
   a first gate area positioned on the active pattern and traversing the first channel area; and
   a second gate area positioned on the active pattern and traversing the second channel area, and
   wherein the edge is part of the first gate area or the second gate area, and the connection line connects the edge to the scan line of the display and surrounds the second conductive area together with the first gate area, the second gate area, and the scan line.

3. The thin film transistor of claim 2, wherein the scan line of the display, the first gate area, the second gate area, and the connection line extend in a closed loop form.

4. The thin film transistor of claim 3, wherein the gate electrode does not overlap with the second conductive area.

5. The thin film transistor of claim 1, wherein the first conductive area, the second conductive area, and the third conductive area comprise conductive materials, and the first channel area and the second channel area comprise semiconductor materials.

6. The thin film transistor of claim 5, wherein the active pattern comprises polysilicon and the gate electrode comprises metal.

7. The thin film transistor of claim 6, wherein ions are doped in the first conductive area, the second conductive area, and the third conductive area.

8. The thin film transistor of claim 1, wherein the second conductive area has one or more curves.

9. The thin film transistor of claim 1, wherein the gate electrode and the connection line are positioned on a same layer of the display as the scan line of the display.

10. The thin film transistor of claim 1, wherein the connection line is positioned on a different layer of the display than the gate electrode and the scan line of the display.

11. The thin film transistor of claim 10, wherein the connection line respectively connects the edge of the gate electrode and the scan line through different contact holes.

12. An organic light emitting diode display, comprising:
    a substrate;
    an organic light emitting diode on the substrate; and
    a thin film transistor connected with the organic light emitting diode,
    the thin film transistor comprising:
      a gate electrode extending from a scan line of the display and having an edge;
      a connection line connecting the edge of the gate electrode to the scan line; and
      an active pattern positioned corresponding to the gate electrode on a different layer of the display than the gate electrode, the active pattern comprising a first conductive area, a first channel area adjacent to the first conductive area, a second conductive area spaced apart from the first conductive area with the first channel area therebetween, a second channel area spaced apart from the first channel area with the second conductive area therebetween, and a third conductive area spaced apart from the second conductive area with second channel area therebetween.

13. The organic light emitting diode display of claim 12, wherein the organic light emitting diode comprises:
    a first electrode connected to the thin film transistor;
    an organic emission layer on the first electrode; and
    a second electrode on the organic emission layer.

* * * * *